(12) United States Patent
Bet-Shliemoun

(10) Patent No.: US 9,426,918 B2
(45) Date of Patent: Aug. 23, 2016

(54) SOCKET PACKAGE INCLUDING INTEGRATAED CAPACITORS

(75) Inventor: Ashur S. Bet-Shliemoun, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 0 days.

(21) Appl. No.: 12/366,208

(22) Filed: Feb. 5, 2009

(65) Prior Publication Data

US 2010/0197151 A1    Aug. 5, 2010

(51) Int. Cl.
*H01R 13/7195* (2011.01)
*H05K 7/10* (2006.01)
*H01R 13/24* (2006.01)
*H05K 1/02* (2006.01)

(52) U.S. Cl.
CPC ........ *H05K 7/1092* (2013.01); *H01R 13/7195* (2013.01); *H01R 13/2485* (2013.01); *H05K 1/0231* (2013.01)

(58) Field of Classification Search
CPC ............ H01R 12/714; H01R 12/7082; H01R 13/2421; H01R 12/716
USPC .......................................................... 439/66
See application file for complete search history.

(56) References Cited

U.S. PATENT DOCUMENTS

| | | | | |
|---|---|---|---|---|
| 6,811,410 B2 * | 11/2004 | Figueroa et al. | ............... | 439/68 |
| 7,113,408 B2 * | 9/2006 | Brown | .................... | H01R 13/03 257/E23.078 |
| 7,114,996 B2 * | 10/2006 | Goodman et al. | ............ | 439/700 |
| 7,196,907 B2 * | 3/2007 | Zheng | ................ | H01R 13/2435 361/760 |
| 7,297,004 B1 * | 11/2007 | Shuhart | .............. | H01R 13/2421 439/66 |
| 7,341,485 B2 * | 3/2008 | Polnyi | ................ | H01R 13/2435 439/591 |
| 7,946,855 B2 * | 5/2011 | Osato | ................... | H05K 7/1069 324/755.05 |
| 8,029,291 B2 * | 10/2011 | Park | ......................... | B21F 3/02 439/66 |
| 8,057,241 B2 * | 11/2011 | Tamura | .............. | H01R 12/7082 439/66 |
| 8,610,447 B2 * | 12/2013 | Lee | ..................... | G01R 1/06722 324/756.02 |
| 2007/0026699 A1 * | 2/2007 | Tahahashi | ............ | H01R 12/714 439/66 |

* cited by examiner

*Primary Examiner* — Truc Nguyen
(74) *Attorney, Agent, or Firm* — Brooks Kushman P.C.

(57) ABSTRACT

A socket package is provided to be positioned between a circuit package and a printed circuit board (PCB). The socket package includes a plurality of interconnects, to connect portions of the circuit package to portions of the PCB. Additionally, a plurality of capacitors are included with the socket package. The capacitors connect the interconnects provided to the socket package, and may be provided in lieu of capacitors in a circuit package, thus decreasing the complexity and build cost of the circuit package.

17 Claims, 5 Drawing Sheets

SOCKET PACKAGE INCLUDING INTEGRATAED CAPACITORS

BACKGROUND OF THE INVENTION

1. Technical Field

The illustrative embodiments generally relate to a socket package including integrated capacitors.

2. Background Art

As processor packages grow increasingly complex, efforts are being made to reduce both the complexity of assembling the processor packages and to reduce the cost of package assembly.

Currently, a semiconductor package such as an integrated circuit may require mechanical and electrical connection with a printed circuit board (PCB). In the ball grid array (BGA) connection technique, one side of the package includes solder balls and one side of the PCB includes metal pads arranged in a pattern corresponding to the solder balls. The package is placed on the PCB such that the package and the PCB form an assembly with the corresponding solder balls and pads meeting. The assembly is heated causing the corresponding solder balls and pads to form solder joints thereby mechanically and electrically connecting the package and the PCB together.

The column grid array (CGA) connection technique somewhat solves the problem of different CTEs between a package and a PCB. In this technique, the solder balls are replaced with solder columns which have a lower stiffness and a higher standoff distance between the package and the PCB. Such features enable the columns to flex with less stress during dimensional expansion between the package and the PCB.

Several present socket packages include, but are not limited to, land grid arrays (LGAs) and direct attach interconnects (DAIs). DAIs are described in detail in co-pending application Ser. No. 11/950,592, filed on Dec. 5, 2007 now abandoned and co-pending application Ser. No. 12/262,662, filed on Oct. 31, 2008, now abandoned, the entire contents of which are incorporated herein. These socket packages are interposed between a processor package and a PCB (such as a motherboard).

Generally, these existing socket packages provide a means to connect a processor package to the PCB, and they often consist of a plastic (or other material) housing and an array of holes to receive pins included in a processor package.

In addition to serving to connect processor packages to the PCB, LGAs and DAIs may act to and absorb stresses associated with coefficient of thermal expansion (CTE) mismatches between the package and the PCB during temperature cycling and/or lifetime of the assembly.

SUMMARY OF THE INVENTION

In one illustrative embodiment, a socket apparatus serves as an intermediary device between a chip package and a PCB. The socket apparatus includes a housing having planar top and bottom sides lying in parallel planes defined by x and y axes. This housing is often constructed from a material having low or no conductivity, such as plastic.

The apparatus also includes a plurality of interconnection portions. The interconnecting portions extend along the z axis between the top and bottom sides of the housing. The interconnecting portions serve to connect first contacts included in the chip package to second contacts included in the PCB.

Finally, in this illustrative embodiment, the apparatus includes a plurality of capacitors, at least one capacitor connecting at least a first interconnection portion to at least a second interconnection portion.

In another illustrative embodiment, a DAI includes a housing having planar top and bottom sides lying in parallel planes defined by x and y axes. The housing includes, among other things, a plurality of passages extending along the z axis between the top and bottom sides of the housing.

Additionally, the DAI includes a plurality of spring contacts each having a middle portion, a top end, and a bottom end. Each spring contact is individually disposed within a respective one of the passages such that the top end of the spring contact extends out through the top side of the housing and the bottom end of the spring contact extends out through the bottom side of the housing.

The DAI also includes a plurality of capacitors, at least one capacitor connecting at least a first spring contact to at least a second spring contact.

BRIEF DESCRIPTION OF THE DRAWINGS

Other objects, aspects and characteristics of the illustrative embodiments will become apparent from the following detailed description of exemplary embodiments, when read in view of the accompanying drawings, in which.

DETAILED DESCRIPTION OF THE PREFERRED EMBODIMENT(S)

The present invention is described herein in the context of particular exemplary illustrative embodiments. However, it will be recognized by those of ordinary skill that modification, extensions and changes to the disclosed exemplary illustrative embodiments may be made without departing from the true scope and spirit of the instant invention. In short, the following descriptions are provided by way of example only, and the present invention is not limited to the particular illustrative embodiments disclosed herein.

Figure 1:
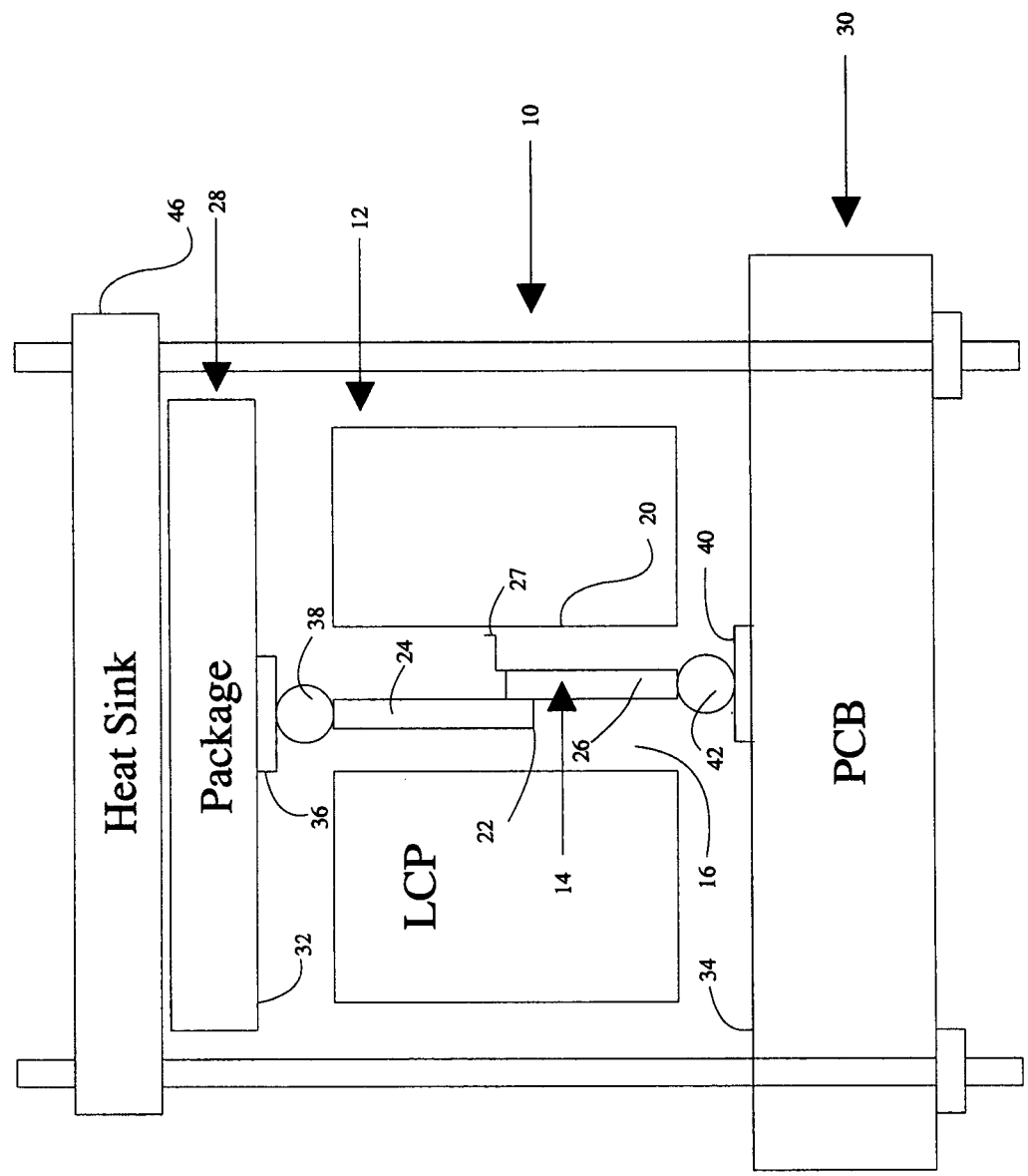
FIG. 1 shows an exemplary illustrative cross-section of a portion of a DAI socket package.

Referring now to FIG. 1, a side view of an exemplary illustrative direct attach interconnect 10 is shown. Interconnect 10 includes a liquid crystal polymer (LCP) housing 12 and a plurality of metal spring contacts 14 (only one spring contact being shown). Housing 12 includes a plurality of passages 16 (only one passage being shown) arranged in a pattern and extending through top and bottom sides 18, 20 of housing 12. Spring contacts 14 are individually disposed within and extend out of respective passages 16.

Although an exemplary DAI has been provided for purposes of example, the present invention is in no way limited to use in DAIs. It is suitable for application in an LGA and other type of socket packages.

Interconnect 10 is placed between a package 28 and a printed circuit board (PCB) 30 to mechanically and electrically connect the package and the PCB. To this end, package 28 and PCB 30 sandwich housing 12 with spring contacts 14 being soldered at one end to the package and soldered at the other end to the PCB in order for the package and the PCB to be mechanically and electrically connected together. Interconnect 10 absorbs stresses associated with coefficient of thermal expansion (CTE) mismatches between package 28 and PCB 30 (which are formed of two different materials) during temperature cycling and/or lifetime of the assembly. This is accomplished in part by spring contacts 14 being able to float and move relative to housing 12 while being soldered to package 28 and PCB 30 in order to move with the expansion between the two different materials of the package and the PCB. That is, spring contacts 14 are held by housing 12 but are decoupled from the housing such that pressure/forces caused by expansion of package 28 and PCB 30 relative to one another minimizes stress on solder joints formed with the spring contacts as such pressure/forces are absorbed by the spring contacts themselves as they are movable in x, y, and z directions.

In general, interconnect 10 holds contact springs 14 in a desired array configuration. Interconnect 10 further absorbs compression forces between package 28 and PCB 30 to prevent such forces from damaging contact springs 14.

Each spring contact 14 may include a middle portion 22, a top end 24, and a bottom end 26. A connector 28 extends between middle portion 22 of a spring contact 14 and passage 16 for spring contact 14. Connector 28 movably connects middle portion 22 of spring contact 14 to passage 16 such that the spring contact may move in the z direction relative to its passage. Top end 24 of spring contact 14 extends out of passage 16 through top side 18 of housing 12. Bottom end 26 of spring contact 14 extends out of passage 16 through bottom side 20 of housing 12. As such, housing 12 holds spring contacts 14 in place in the pattern of passages 16.

Housing 12 may be placed between package 28 and PCB 30 with top side 18 of the housing facing a bottom side 32 of the package and bottom side 20 of the housing facing a top side 34 of the PCB. Bottom package side 32 may include a plurality of solder pads 36 (only one solder pad 36 being shown) arranged in the pattern corresponding to the pattern of spring contacts 14 such that each spring contact and each solder pad form a corresponding pair. Top end 24 of each spring contact 14 may include a solder ball 38. Solder balls 38 may be soldered to the corresponding solder pads 36 to form mechanical and electrical connections between spring contacts 14 and package 28. Each soldered solder ball 38 and corresponding solder pad 36 form a solder joint between top end 24 of spring contact 14 and package 28. Similarly, top PCB side 34 may include a plurality of solder pads 40 (only one solder pad 40 being shown) also arranged in the pattern corresponding to the pattern of spring contacts 14 such that each spring contact and each solder pad 40 form a corresponding pair. Bottom end 26 of each spring contact 14 may include a solder ball 42. Solder balls 42 may be soldered to the corresponding solder pads 40 to form mechanical and electrical connections between spring contacts 14 and package 30. Each soldered solder ball 42 and corresponding solder pad 40 form a solder joint between bottom end 26 of spring contact 14 and PCB 30.

Housing 12 may include features such as guide pins or the like on its top and bottom sides 18, 20 which are used to align the housing with package 28 and PCB 30.

The position of the corresponding solder pads and solder balls may be interchanged with respect to either of ends 24, 26 of spring contacts 14. For instance, top end 24 of a spring contact 14 may include a solder pad instead of solder ball 38, and a corresponding solder ball instead of the corresponding solder pad 36 may be placed on bottom package side 32. Likewise, bottom end 26 of a spring contact 14 may include a solder pad instead of solder ball 42, and a corresponding solder ball instead of the corresponding solder pad 40 may be placed on top PCB side 34. Further, any of the solder balls may be replaced with solder paste.

As described, spring contacts 14 may be connected at their middle portions 22 within respective passages 16 of housing 12 by respective connectors 28. Connectors 28 provide minimal connection between spring contacts 14 and passages 16 such that the spring contacts are freely movable in the z direction either away from PCB 30 and toward package 28 or away from the package and toward the PCB. Passages 16 have a large enough circumference such that spring contacts 14 do not come into contact with housing 12 along the side walls of the passages while moving in the x, y, and z axes during expansion between package 28 and PCB 30.

Further, each spring contact 14 itself may have a resilient spring action such that top end 24 of the spring contact may be movable in the z direction away from package 28 and toward PCB 30 while bottom end 26 of the spring contact may be movable in the z direction away from the PCB and toward the package. Each spring contact 14 may also include a metal such as a copper alloy like beryllium copper.

Spring contacts 14 may not be connected at their top and bottom ends 24, 26 to passages 16 as the top and bottom spring contact ends respectively come into contact with package 28 and PCB 30 via solder and ultimately become solder joints. In conjunction, middle portion 22 of spring contacts 14 are movably connected to respective passages 16 of housing 12. As a result, housing 12 holds spring contacts 14 in their correct position (i.e., in the pattern corresponding to the patterns of the solder pads on bottom package side 32 and top PCB side 34. Further, the solder joints may be decoupled from housing 12 and the associated stresses and CTE mismatches between package 28 and PCB 30.

FIG. 1 illustrates interconnect 10 between package 28 and PCB 30 just prior to the mechanical interconnect and electrically connecting the package and the PCB together to form an assembly. In order to form this assembly, package 28 is moved downward relative to housing 12 such that bottom package side 32 contacts top housing side 18. Likewise, PCB 30 is moved upward relative to housing 12 such that top PCB side 34 contacts bottom housing side 20. As a result, package 28 and PCB 30 sandwich housing 12. Solder pads 36 of package 28 and solder balls 38 of top ends 24 of the corresponding spring contacts 14 are soldered together (e.g., via re-flow soldering) and solder pads 40 of PCB 30 and solder balls 42 of bottom ends 26 of the corresponding spring contacts are also soldered together to form the mechanically and electrically interconnected assembly. Housing 12 further functions to absorb compression forces between package 28 and PCB 30 when assembled together such that spring contacts 14 can still freely move in both z directions with each end of the spring contacts being movable in x-y directions in order to accommodate expansion between the package and the PCB.

Thermal expansion between package 28 and PCB 30 may occur as a result of electronic components of the package and the PCB generating heat. For instance, package 28 may be an integrated circuit which can generate heat fluxes of several hundred watts per square centimeter. Package 28 includes heat sink 46 on its top side. Heat sink 46 functions to disburse some of this heat and may include any of well known structures for removing heat from electronic components such as a cold plate, a finned sink, a heat pipe, etc.

Figure 2:
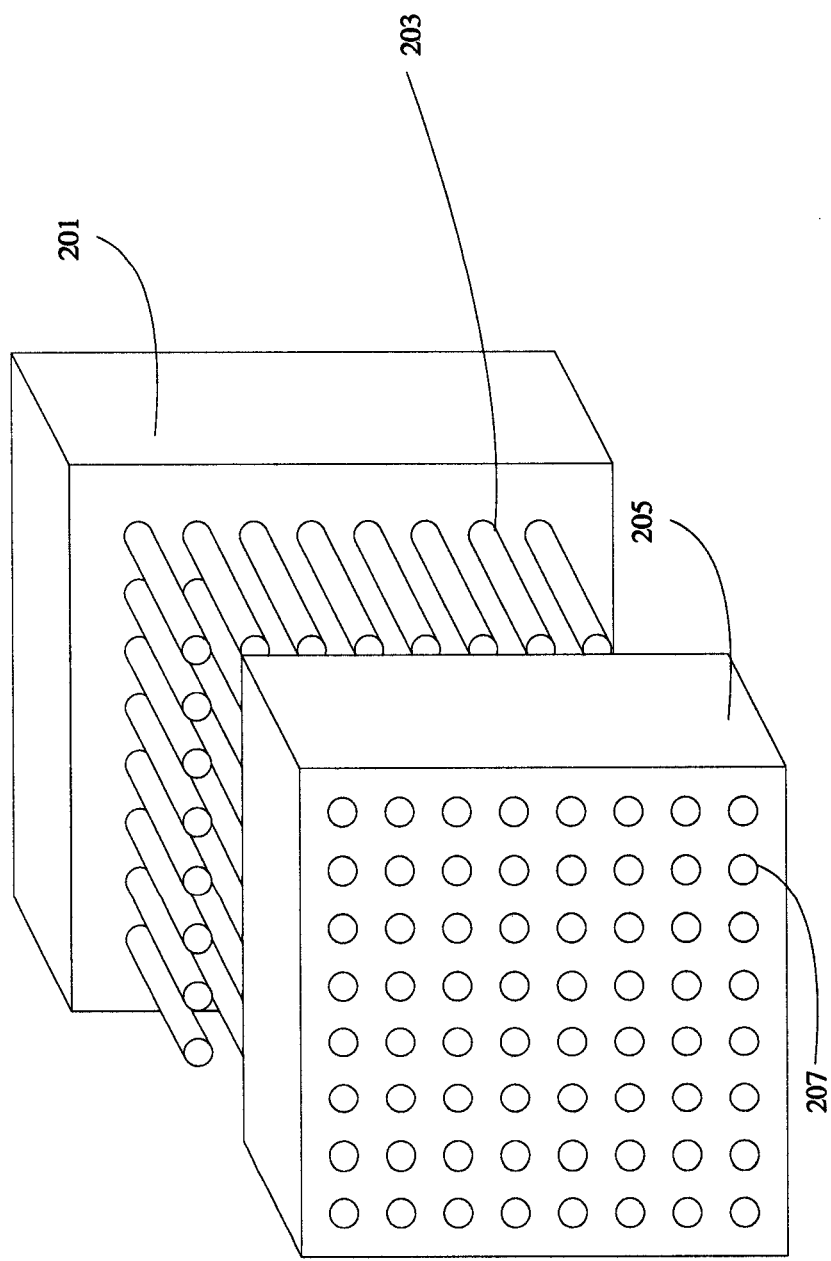
FIG. 2 shows an example of a chip package and a socket package.

FIG. 2 shows an example of a chip package and a socket package. In this illustrative embodiment, circuit package 201 is provided with a plurality of pins 203. These pins transfer signals from the circuit package to a PCB. Since there may be stresses due to differences in thermal expansion between the circuit package and the PCB, a socket package 205 is interposed between the PCB and the circuit package.

Socket package 205 has a plurality of interconnects 207 provided thereto. These interconnects serve to connect the pins 203 of the circuit package 201 to a PCB. In this particular illustrative embodiment, the interconnects are a plurality of passages 207 that extend through both sides of the socket package. The pins 203 are inserted into the passages and thereby connect to the PCB.

Figure 3:
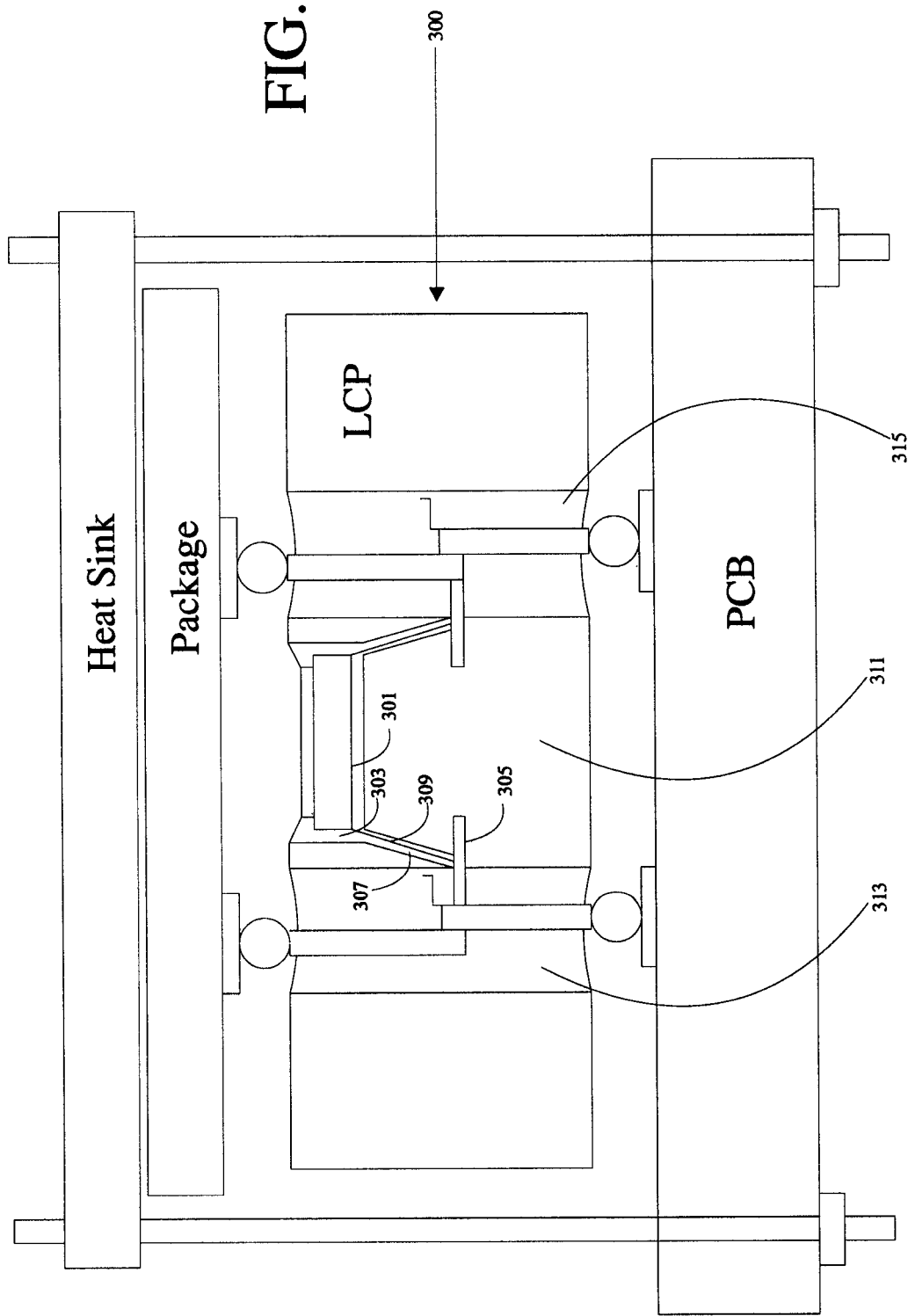
FIG. 3 shows an exemplary illustrative cross-section of a DAI socket package including a socket package mounted capacitor.

FIG. 3 shows an exemplary illustrative cross-section of a DAI socket package including a socket package mounted capacitor. In this illustrative embodiment, a portion 311 of socket package 300 has a recess 303 provided thereto. Connection channels 307 run from the recess 303 to contact plates 305.

The contact plates, in this embodiment, are made from a conductive alloy and contact a substantially central portion, along the z-axis, of the interconnection channels 313, 315. In this illustrative embodiment, the contact plate 305 contacts a spring portion provided to the socket package 300 and running through the interconnect channel 313. The contact plate could also, for example, contact a pin passing through interconnect channel 313.

Figure 4A:
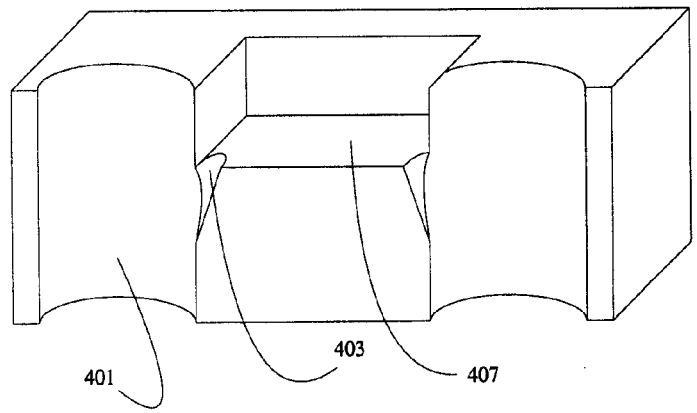
FIGS. 4A-4C shows exemplary illustrative examples of cross sections of socket packages having exemplary mounting recesses provided thereto.
Figure 4B:
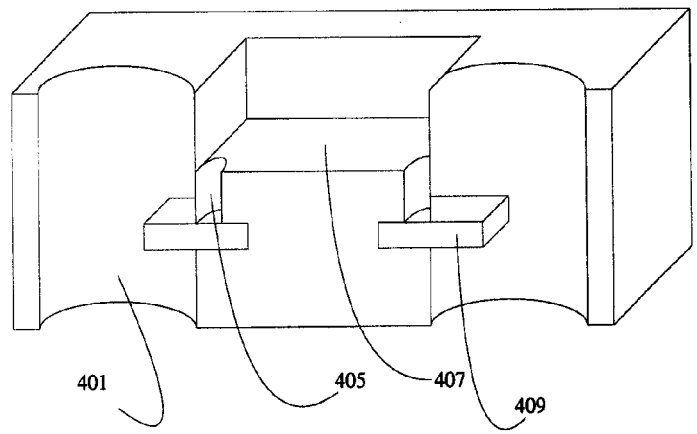
Figure 4C:
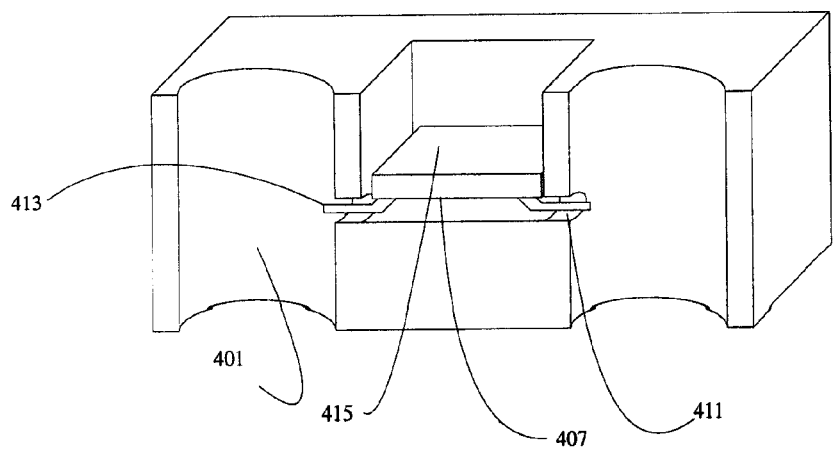

Additionally, as shown in FIGS. 4A and 4C, for example, contact plates may not be necessary.

In this illustrative embodiment, a lead 309 runs from capacitor 301 to contact plate 305. The lead serves to connect the capacitor to the contact plate, and thereby to the circuit package.

Traditionally, capacitors are included in the circuit package itself. For example, decoupling capacitors may be built into a circuit. But, as circuits grow evermore complex, these capacitors need to be routed and connected around and ever growing array of package layers and components. By including capacitors, such as decoupling capacitors, in a socket package, chip package complexity and creation costs are kept down. And, since the socket package is relatively simple in comparison to the chip package, the addition of the capacitors to the socket package is a comparatively simple and inexpensive solution.

FIGS. 4A-4C show exemplary illustrative examples of cross sections of socket packages having exemplary mounting recesses provided thereto.

In FIG. 4A, a capacitor recess 407 is provided such that leads of a capacitor (not shown) will be directly exposed to the interconnection passages 401. The capacitor will be seated in recess 407, and the leads will pass through channels 403 and into the interconnection passages 401.

In FIG. 4B, a capacitor recess is provided such that leads of a capacitor (not shown) will be in contact with contact plates 409. This arrangement resembles the exemplary arrangement shown in FIG. 3.

Again, a capacitor will be seated in recess 407, and the leads therefrom will pass into channels 405 to contact plates 409. The plates 409 extend into the interconnection passages 401, where they can contact a pin, spring, or other interconnection device.

In FIG. 4C, channels 411 connecting directly to interconnect passages 401 are provided. This is similar to FIG. 4A, although the recess 407 is slightly deeper. An exemplary capacitor is also shown in this figure.

Capacitor 415 has two leads 413. The leads extend through passages 411 and the exposed ends thereof are within the interconnect channels 401. These exposed ends can then contact a pin, spring, or other interconnection device.

Figure 5:
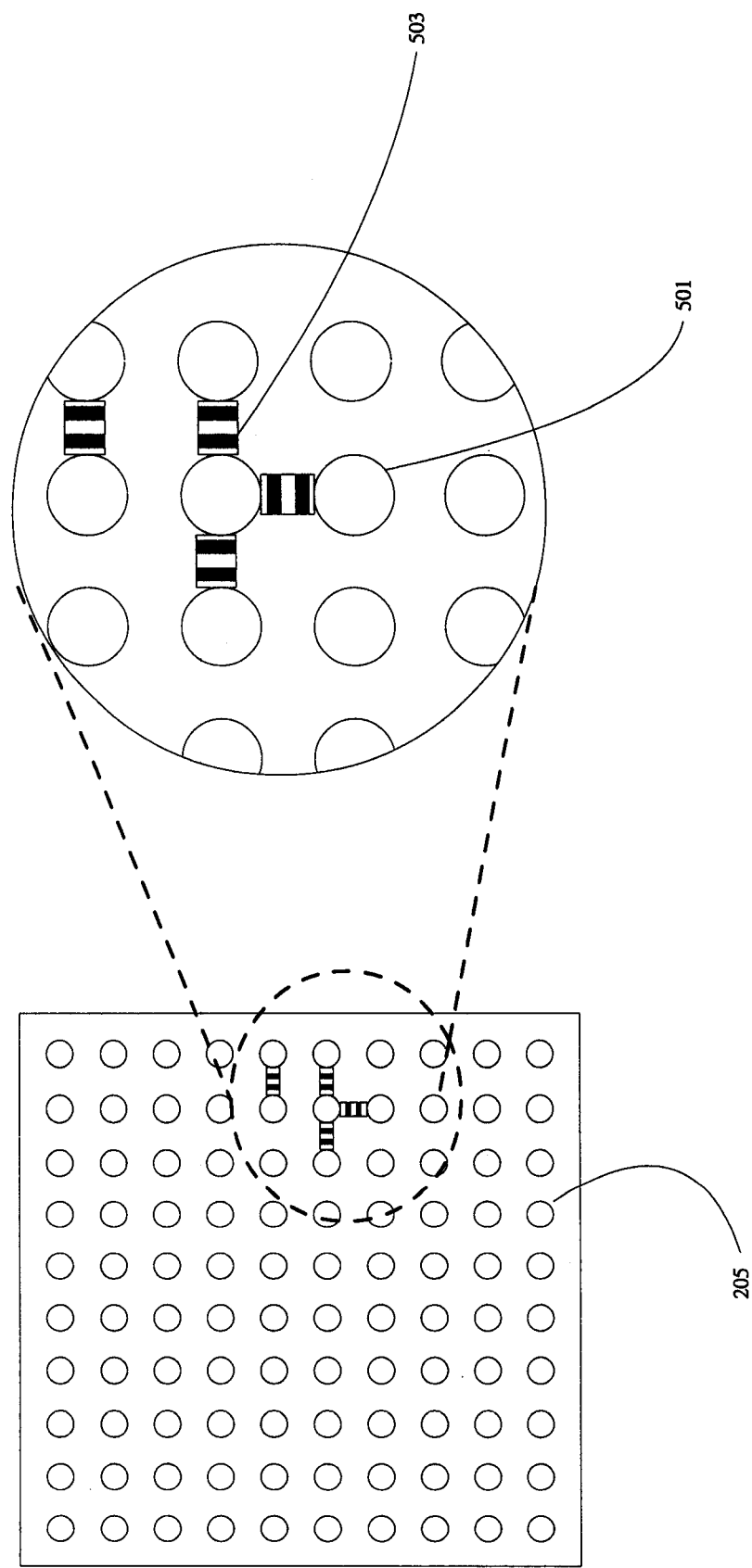
FIG. 5 shows a top-down view of an exemplary illustrative socket package having capacitors mounted thereto.

FIG. 5 shows a top-down view of an exemplary illustrative socket package 205 having capacitors mounted thereto.

In this illustrative embodiment (which could also be a bottom-up view), a plurality of capacitors 503 are provided for connecting interconnect passages 501. The capacitors are seated on a surface of the socket package 205, and can be positioned in recesses provided thereto. The capacitors could also be surface mounted to the socket package if desired.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A socket apparatus to serve as an intermediary device between a chip package including first contacts and a PCB including second contacts, comprising:
    a housing having planar top and bottom sides lying in parallel planes defined by x and y axes;
    a plurality of spring contacts, extending between the top and bottom sides of the housing, along a z axis, and flexible along the x, y and z axes, to connect the first contacts to the second contacts, wherein at least one spring contact is connected via a connector to an interior portion of a passage, extending along the z-axis and surrounding the spring contact; and
    a plurality of capacitors, at least one capacitor connecting at least a first spring contact to at least a second spring contact.

2. The apparatus of claim 1, wherein the connector is connected to a substantially central, along the z-axis, portion of the spring contact.

3. The apparatus of claim 1, wherein the plurality of capacitors are mounted within recesses provided within at least one of the planar top or the planar bottom sides.

4. The apparatus of claim 1, wherein a first lead of the at least one capacitor contacts a substantially central, along the z-axis, portion of at least the first spring contact, and a second contact of the at least one capacitor contacts a substantially central, along the z-axis, portion of at least the second spring contact.

5. The apparatus of claim 1, wherein at least one of the capacitors serves as a decoupling capacitor.

6. The apparatus of claim 1, wherein the spring contact is disposed within the passage such that the spring contact does not contact any portion of the passage.

7. A direct attach interconnect, comprising:
    a housing having planar top and bottom sides lying in parallel planes defined by x and y axes;
    a plurality of passages extending along a z axis between the top and bottom sides of the housing;
    a plurality of single-element spring contacts each having a middle portion, a top end, and a bottom end, each spring contact being individually disposed within a respective one of the passages such that the top end of the spring contact extends out through the top side of the housing and the bottom end of the spring contact extends out through the bottom side of the housing, wherein the spring contacts do not contact any portion of the respective passages in which they are disposed, and where the spring contacts are further connected to the passages via at least one connector, the spring contact flexible along the x, y and z axes within the passage; and a plurality of capacitors, at least one capacitor connecting at least a first spring contact to at least a second spring contact.

8. The apparatus of claim 7, wherein the plurality of capacitors are surface-mounted capacitors, mounted to at least one of the planar top or the planar bottom sides.

9. The apparatus of claim 7, wherein the plurality of capacitors are mounted within recesses provided within at least one of the planar top or the planar bottom sides.

10. The apparatus of claim 7, wherein a first lead of the at least one capacitor contacts a substantially central, along the z-axis, portion of at least the first interconnection portion, and a second contact of the at least one capacitor contacts a substantially central, along the z-axis, portion of at least the second interconnection portion.

11. The apparatus of claim 7, wherein at least one of the capacitors serves as a decoupling capacitor.

12. A socket package apparatus comprising:
a plurality of spring contacts, the spring contacts being disposed in passages passing between a top and bottom surface of a housing, wherein the spring contacts do not contact the passages and wherein the spring contacts can flex along an x, y and z axis within the passages, the z-axis paralleling a radial axis of the passage, to connect a circuit package to a PCB;
one or more recesses, at least one of the recesses arranged on a first surface of the socket package between two of the spring contacts;
a plurality of channels provided to the at least one recess, a first of the channels arranged on a first side of the recess corresponding to a first of the two spring contacts which the recess is arranged between, and a second of the channels arranged on a second side of the recess corresponding to a second of the two spring contacts which the recess is arranged between, wherein the channels provide access from the passages housing the respective interconnecting portions to the at least one recess.

13. The socket package apparatus of claim 12, further including a plurality of conductive contacts, each of the conductive contacts positioned at an spring-contact-end of a channel, wherein a portion of each conductive contact extends into the channel and a portion of the conductive contact extends into each corresponding passage housing the respective spring contact, such that the conductive contact contacts the spring contact housed in the corresponding passage.

14. The socket package apparatus of claim 13, wherein the conductive contacts are positioned at substantially central, depthwise, between the top and bottom surfaces, regions of the corresponding spring contacts.

15. The socket package apparatus of claim 12, wherein the channels connect to the passages housing the respective spring contacts at substantially central, depthwise, between the top and bottom surfaces, regions of the respective interconnecting portions.

16. The socket package apparatus of claim 12, wherein the PCB includes a land grid array (LGA).

17. The socket package apparatus of claim 12, wherein further including a direct attach interconnect (DAI).

* * * * *